(12) United States Patent
Yabuta

(10) Patent No.: US 11,822,258 B2
(45) Date of Patent: Nov. 21, 2023

(54) FOIL TRAP AND LIGHT SOURCE APPARATUS INCLUDING THE SAME

(71) Applicant: Ushio Denki Kabushiki Kaisha, Tokyo (JP)

(72) Inventor: Hironobu Yabuta, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 161 days.

(21) Appl. No.: 17/687,459

(22) Filed: Mar. 4, 2022

(65) Prior Publication Data

US 2022/0291597 A1 Sep. 15, 2022

(30) Foreign Application Priority Data

Mar. 11, 2021 (JP) ................................ 2021-038849

(51) Int. Cl.
*G03F 7/20* (2006.01)
*H05G 2/00* (2006.01)
*G03F 7/00* (2006.01)

(52) U.S. Cl.
CPC ....... *G03F 7/70916* (2013.01); *G03F 7/70033* (2013.01); *H05G 2/005* (2013.01); *H05G 2/008* (2013.01)

(58) Field of Classification Search
CPC . G03F 7/70916; G03F 7/70033; H05G 2/005; H05G 2/008
See application file for complete search history.

(56) References Cited

FOREIGN PATENT DOCUMENTS

JP 6075096 B 8/2014

*Primary Examiner* — Nicole M Ippolito
*Assistant Examiner* — Hanway Chang
(74) *Attorney, Agent, or Firm* — Kenichiro Yoshida

(57) ABSTRACT

A foil trap that captures debris released from a plasma includes a hub structure, a plurality of foils, and a shield member. The hub structure has a circumferential surface portion and a front surface portion facing the plasma. The foils are arranged radially around the hub structure and are supported by brazing on the circumferential surface portion. The shield member is disposed on the front surface portion, has a circumferential edge portion that shields the circumferential surface portion from the plasma, and forms a thermal resistance section between the shield member and the hub structure.

13 Claims, 13 Drawing Sheets

FOIL TRAP AND LIGHT SOURCE APPARATUS INCLUDING THE SAME

BACKGROUND ART

The present invention relates to a foil trap that captures debris released from high-temperature plasma, which is an extreme ultraviolet light source, and a light source apparatus including the foil trap.

In recent years, a light source for exposure has been being developed to emit light at a shorter wavelength as semiconductor integrated circuits are miniaturized and highly integrated. As a next-generation light source for semiconductor exposure systems, an extreme ultraviolet (hereinafter, occasionally referred to as "EUV") light source apparatus that emits extreme ultraviolet light at a wavelength of, particularly, 13.5 nm is being developed.

Several methods are known to emit EUV light (EUV radiation) from the EUV light source apparatus. One of such methods involves a method of generating high-temperature plasma by heating and exciting an extreme ultraviolet emission seed (EUV emission seed), and extracting EUV light from the high-temperature plasma. EUV light source apparatuses that employ such a method are categorized into a laser produced plasma (LPP) method and a discharge produced plasma (DPP) method, depending upon a method used to generate high-temperature plasma.

A DPP-based EUV light source apparatus applies a high voltage across a pair of electrodes, between which a discharge gas containing an extreme ultraviolet light emission seed (vaporized plasma raw material) has been supplied, to generate high-density plasma upon electric discharging, and uses extreme ultraviolet light emitted therefrom. In the DPP-based EUV light source apparatus, a method has been proposed that involves supplying a surface of the electrodes, between which electric discharge is generated, with a liquid plasma raw material, for example, Sn (tin) or Li (lithium), including the extreme ultraviolet light emission seed, irradiating the raw material with an energy beam such as a laser beam for evaporation thereof, and then generating high-temperature plasma upon the electric discharging. This method is sometimes referred to as a laser assisted discharge produced plasma (LDP) method.

In contrast, an LPP-based EUV light source apparatus irradiates a target material with a laser beam to excite the target material and generate plasma.

EUV light source apparatuses are used as light source apparatuses for semiconductor exposure systems (lithography systems) in manufacturing semiconductor devices. Alternatively, EUV light source apparatuses are used as light source apparatuses for mask inspection systems used in lithography. In other words, the EUV light source apparatuses are used as light source apparatuses for other optical system devices (utilization devices) that use EUV light. Since EUV light attenuates significantly in the atmosphere, the space region through which EUV light passes from the plasma to the utilization device is placed in a reduced-pressure atmosphere or vacuum environment to suppress the attenuation of the EUV light.

Meanwhile, in the EUV light source apparatus, the plasma releases debris at high speed. Debris includes particles of the plasma raw material (or particles of tin when the plasma raw material is tin). When plasma is generated in the DPP or LDP method, the debris may also contain particles of the material of discharge electrodes, which have been sputtered due to the generation of plasma. Upon reaching the utilization device, the debris may damage or contaminate the reflective film of the optical element in the utilization device, degrading its performance. Hence, a debris mitigation device (also referred to as debris mitigation tool (DMT)) has been proposed to capture the released debris to prevent it from entering the utilization device.

In the debris mitigation device, Japanese Patent No. 6075096 discloses a rotary foil trap that includes a central pillar (a hub) connected with a rotation shaft, and a plurality of foils (thin films or thin flat plates) radially arranged around the central pillar. The rotary foil trap captures debris released from the plasma by rotating a plurality of the foils around the above rotation shaft. The rotary foil trap is disposed to face the high-temperature plasma and allows the light emitted from the plasma to pass through, while the debris released from the plasma collides with the rotary foil traps, thereby preventing debris from entering the utilization device.

The rotary foil trap, which is disposed to face the high-temperature plasma, receives a large amount of heat load during the operation of the EUV light source device, and it can be heated to 500 to 700° C. or higher depending on the input energy to the plasma. In particular, since the rotary foil trap is disposed at a very short distance from the plasma, which is the emission point, and is thus constantly exposed to fast-moving debris from the plasma, occurring abrasion (erosion) due to collision of this debris.

In addition, a plurality of the foils are fixed to the central pillar by brazing or other means, and gold brazing or palladium brazing, which has relatively high thermal resistance, is used for brazing as the hard brazing metal. However, when debris originated from tin (Sn), which is a high-temperature plasma raw material, adheres to the brazed portion, a chemical reaction occurs between the brazing materials (gold brazing, palladium brazing, etc.) and tin (Sn), causing the brazing material to deteriorate. This deteriorating brazing material has lower mechanical strength than that of the original brazing material. Hence, when the rotary foil trap is rotating, the centrifugal force applied to the foils is likely to cause the brazed portion to come off, increasing a risk of damaging the rotary foil trap.

Hence, Japanese Patent No. 6075096 discloses a foil trap provided with a replaceable shield member on the side of the central pillar facing the debris. The above shield member is structured and arranged such that the brazed portions between the foils and the central pillar are shielded from debris consisting of tin (Sn) flying from the high-temperature plasma, thereby preventing the above debris from adhering to the above brazed portion. Therefore, this configuration suppresses the deterioration of the brazing material, preventing defects including broken joints at the brazed portion in the rotary foil trap. In addition, since the shield member is configured to be replaceable, even if the shield member is subject to abrasion (erosion) caused by debris moving at high speed, replacing the shield member will eliminate the need for replacing the foil trap itself.

Furthermore, Japanese Patent No. 6075096 discloses that an intermediate member is provided between the above shield member and the central pillar, the intermediate member being thermally conductive and made of a material softer than both of the material constituting the above shield member and the material constituting the above central pillar. Providing the above-mentioned intermediate member between the shield member and the central pillar improves heat conduction from the shield member to the central pillar, thereby enhancing the cooling effect of the shield member due to the cooling mechanism provided in the central pillar.

SUMMARY OF THE INVENTION

In light source apparatuses for exposure systems, EUV light emitted from plasmas is expected to be used for exposure as efficiently as possible. For this reason, the rotary foil trap is preferably configured such that the amount of EUV light that is blocked is minimized to prevent lowering the utilization efficiency of EUV light as much as possible.

In contrast, light source apparatuses for inspection systems can allow a small utilization efficiency of EUV light emitted from high-temperature plasma compared with light source apparatuses for exposure. In other words, a smaller fraction of the EUV light is extracted from the EUV light emitted from the plasma. For this reason, an aperture with an opening for extracting a part of EUV light is provided between the high-temperature plasma and the inspection system. The aperture also functions as a heat shield plate that reduces heat radiation from the high-temperature plasma to the rotary foil trap and prevents the overheating of the rotary foil trap.

Here, when the foil trap with improved cooling effect of the shield member as described in Japanese Patent No. 6075096 is applied to a light source apparatus for an inspection system, heat load from plasma onto the shield member is reduced because of the heat shield effect of the aperture, compared with that of the light source apparatus for the exposure system. Under this circumstances, the cooling mechanism of the central pillar causes the temperature of the shield member to drop too low to below the melting point of the debris. (This phenomenon or state is hereinafter referred to as "excessive cooling".) In this situation, when debris (Sn) in a molten state captured by a plurality of the foils adheres to the shield member, the debris deposits on the shield member. Then, the deposited debris increases the thickness of the foil, arising a problem of decreasing the light transmittance of the foil trap. Moreover, since the deposited debris also increases the mass of the foil trap, the load on the motor that drives the rotary foil trap increases and may cause failure, or the rotation speed of the motor fails to be stabilized without adjusting the control parameters. Therefore, the temperature of the shield member is necessary to be maintained at a temperature above the melting point of the debris.

On the other hand, in the rotary foil trap applied to the light source apparatuses for inspection systems, the excessive cooling of the shield member can be prevented by using a small amount of refrigerant circulating to cool the central pillar compared to the case in which it is applied to light source apparatuses for exposure systems. This measure, however, also results in reducing the cooling effect of the central pillar and each foil in addition to that of the shield member. Hence, this measure poses a problem that it becomes difficult to maintain the temperature of each foil, whose heat load received from the plasma is greater than that of the shield member, at around temperatures that do not cause defects in which the temperature of its brazing portion reaches above the melting point of the brazing material.

In view of the circumstances described above, it is an object of the present invention to provide a foil trap that can maintain the temperature at a level that does not cause defects in the brazed portion of the foil, while preventing the excessive cooling of the shield member, and also to provide a light source apparatus provided with the foil trap.

A foil trap according to an embodiment of the present invention is a foil trap that captures debris released from a plasma, and includes a hub structure, a plurality of foils, and a shield member. The hub structure has a circumferential surface portion and a front surface portion facing the plasma. The plurality of foils are arranged radially around the hub structure and are supported by brazing on the circumferential surface portion. The shield member is disposed on the front surface portion, has a circumferential edge portion that shields the circumferential surface portion from the plasma, and forms a thermal resistance section between the shield member and the hub structure.

The foil trap having the above configuration, which has the thermal resistance section between the hub structure and the shield member, is able to reduce the thermal conductivity between the shield member and the hub structure. This configuration prevents the excessive cooling of the shield member due to the cooling action of the hub structure, and is also able to maintain the temperature at a level that does not cause defects in the brazed portion between the hub structure and the plurality of foils.

The thermal resistance section is typically a contact layer between the shield member and the hub structure. The contact layer here refers to a contact interface surface between the shield member and the hub structure. Since the contact interface surface is usually not a perfect surface contact, a certain thermal resistance can arise between them unless there is an intermediate layer having high heat conductive properties between them. The contact layer may include a heat insulating material layer interposed at the contact interface surface.

The hub structure is typically fixed to a front end portion of a rotation shaft including a cooling mechanism. In this case, the hub structure further has a rear surface portion having a fitting portion which the rotation shaft fits. A contact area between the hub structure and the front end portion of the rotation shaft may be larger than a contact area between the hub structure and the shield member. In this manner, providing a difference in the contact area of the shield member and the rotation shaft with respect to the hub structure prevents excessive cooling of the shield member and stably ensures the cooling efficiency of the hub structure with the cooling mechanism of the rotation shaft.

The hub structure may be a connecting body of a hub body that constitutes the circumferential surface portion and a shaft receptor that constitutes the rear surface portion. In this case, a contact area between the hub body and the shaft receptor is larger than a contact area between the hub body and the shield member. When the hub structure is made into a divided structure with the hub body and the shaft receptor, the divided region functions as a thermal resistance section, lowering the heat conductive properties between the hub body and the shaft receptor. This configuration prevents the temperature of each foil from dropping to a temperature lower than the melting point of debris without adjusting the cooling temperature of the hub structure with the cooling mechanism.

The hub body includes a cylindrical portion that constitutes the circumferential surface portion and a partition wall that divides inside of the cylindrical portion in an axial direction. The shield member may have a cylindrical first convex portion having a bottom surface portion that is in contact with the partition wall.

The shaft receptor may have a cylindrical second convex portion having a top portion that constitutes the fitting portion and faces the partition wall, and a flange that constitutes the rear surface portion and is in contact with an end portion of the cylindrical portion.

The foil trap may further include a fastening member that penetrates the bottom surface portion and the partition wall and screws into the front end portion of the rotation shaft.

The foil trap may further include an extended shield member that is fixed to a facing surface of the shield member and has a surface portion, the facing surface being a surface facing the plasma, the surface portion having an area larger than an area of the facing surface.

The extended shield member may have a circumferential edge portion having an annular bent portion that bends toward the plurality of foils.

A light source apparatus in accordance with an embodiment of the present invention includes a plasma generation chamber, a light extraction section that extracts light emitted from a plasma generated in the plasma generation chamber, and a foil trap that is disposed between the plasma generation chamber and the light extraction section and that captures debris released from the plasma. The foil trap includes a rotation shaft, a hub structure, a plurality of foils, and a shield member. The rotation shaft includes a cooling mechanism. The hub structure has a circumferential surface portion and a front surface portion facing the plasma, and is fixed to a front end portion of the rotation shaft. The plurality of foils are arranged radially around the hub structure and are supported by brazing on the circumferential surface portion. The shield member is disposed on the front surface portion, has a circumferential edge portion that shields the circumferential surface portion from the plasma, and forms a thermal resistance section between the shield member and the hub structure.

The light source apparatus may further include an aperture. The aperture is disposed between the plasma generation chamber and the foil trap, and has an opening for extracting a part of light emitted from the plasma.

The foil trap according to the present invention maintains the temperature of the shield member that does not cause defects in the brazed portion of the foil while preventing the excessive cooling of the shield member.

DETAILED DESCRIPTION OF THE EMBODIMENTS

Hereinafter, with reference to the accompanying drawings, embodiments according to the present invention will be described.

First Embodiment

Figure 1:
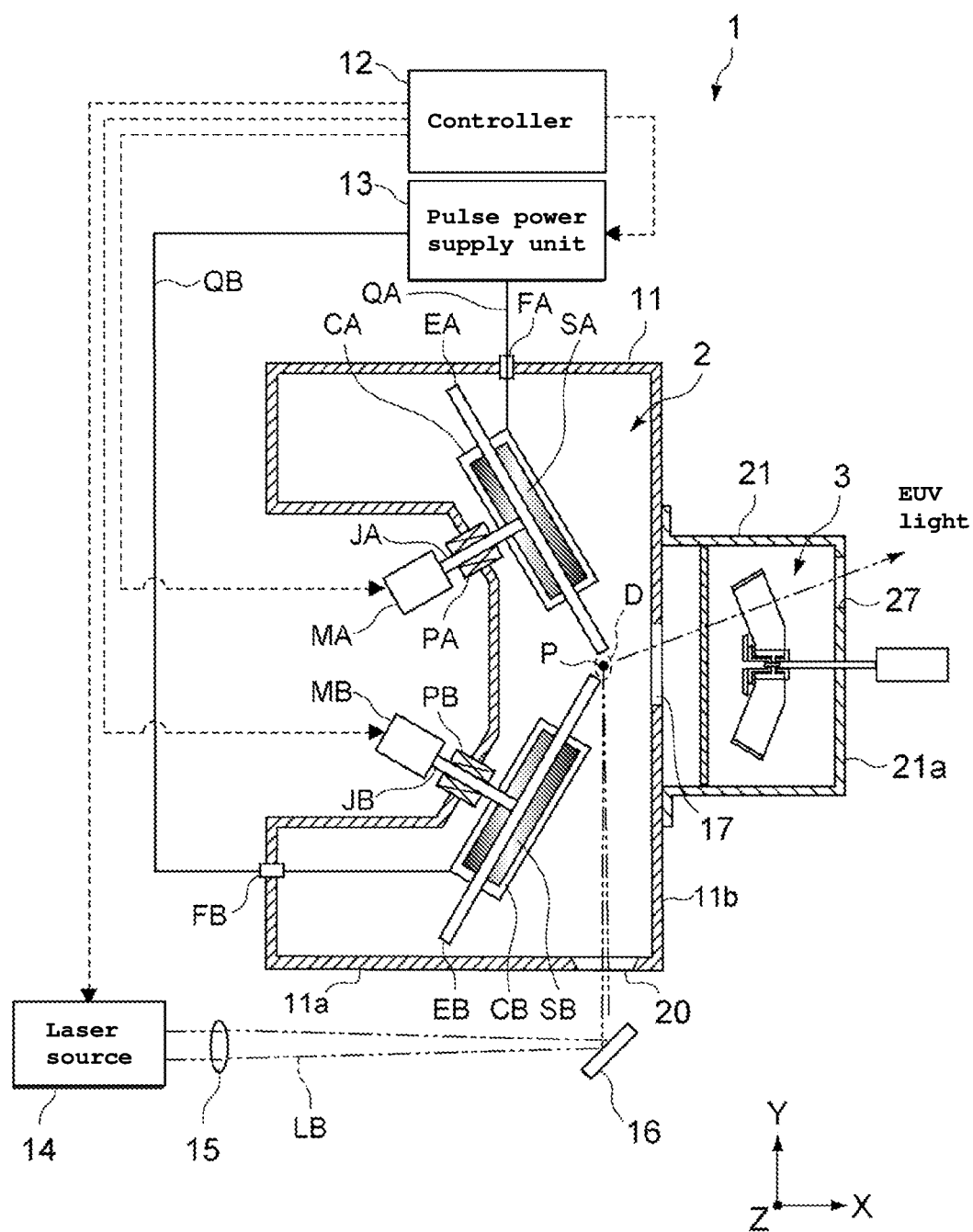
FIG. 1 is a schematic cross-sectional view illustrating the configuration of a light source apparatus provided with a foil trap according to a first embodiment of the present invention.

FIG. 1 is a schematic cross-sectional view illustrating the configuration of an EUV light source apparatus 1 provided with a foil trap according to a first embodiment of the present invention. In the present embodiment, an example of an LDP-based extreme ultraviolet light source apparatus (EUV light source apparatus) for an inspection system is described as the EUV light source apparatus 1.

In the figure, the X, Y, and Z axes represent three mutually orthogonal directions, and the Z axis corresponds to the vertical direction (direction of gravity). Thus, FIG. 1 shows a cross-sectional view of the EUV light source apparatus 1 when it is cut horizontally.

Overall Configuration

In FIG. 1, the EUV light source apparatus 1 emits extreme ultraviolet (EUV) light. The extreme ultraviolet light has a wavelength of 13.5 nm, for example. Specifically, the EUV light source apparatus 1 irradiates plasma raw materials SA and SB in the liquid phase, which have been supplied onto the surfaces of a pair of discharge electrodes EA and EB that generate discharges, respectively, with an energy beam such as a laser beam LB to vaporize the plasma raw materials SA and SB. The discharge of the discharge region D between the discharge electrodes EA and EB then generates plasma P. The plasma P emits EUV light.

The EUV light source apparatus 1 can be used, for example, as a light source apparatus in a mask inspection system used in lithography. In this case, a part of the EUV light emitted from the plasma P is extracted through a window 27 (light extraction section) and guided to the mask inspection system. The mask inspection system uses the EUV light emitted from the window 27 of the EUV light source apparatus 1 as an inspection light to perform a mask blanks inspection or a mask pattern inspection. Using EUV light can support a process of 5 nm to 7 nm.

Figure 2:
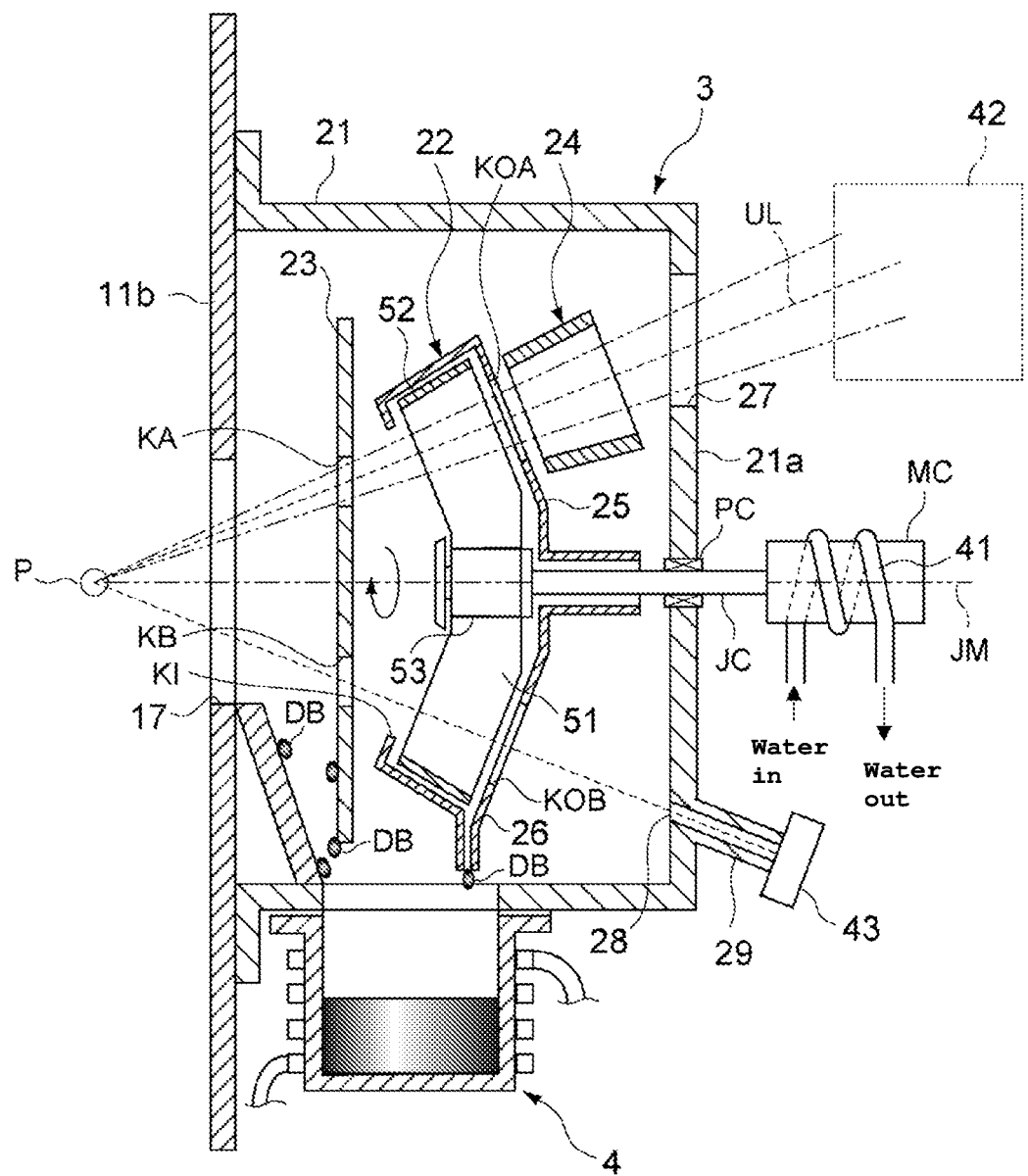
FIG. 2 is a side cross-sectional view illustrating the details of a debris capture section in the above light source apparatus.

The EUV light source apparatus 1 includes a light source section 2, a debris capture section 3, and a debris container 4 (see FIG. 2). FIG. 2 is a side cross-sectional view illustrating the details of the debris capture section 3. The light source section 2 generates EUV light by the LDP method. The debris capture section 3 is a debris mitigation device that captures the debris scattered along with the EUV light emitted from the light source section 2. The debris container 4 houses the debris generated by the light source section 2 and the debris captured by the debris capture section 3.

Light Source Section

The light source section 2 is provided with a chamber 11 that isolates the plasma P generated inside the chamber 11 from the outside. The chamber 11 forms a plasma generation chamber that houses the light source section 2 that generates the plasma P. The chamber 11 is a vacuum enclosure made of a rigid body, e.g., metal, and its interior is maintained in a reduced-pressure atmosphere below a predetermined pressure by a vacuum pump, which is not shown in the figure, in order to generate discharges successively to heat and excite the plasma raw materials SA, SB and to suppress the attenuation of EUV light.

The light source section 2 is provided with a pair of discharge electrodes EA and EB. The discharge electrodes EA and EB are each a disc-shaped member and have the same shape and size. For example, the discharge electrode EA is used as a cathode and the discharge electrode EB is used as an anode. The discharge electrodes EA and EB are formed from a high-melting-point metal such as molybdenum (Mo), tungsten (W), or tantalum (Ta). The discharge electrodes EA and EB are disposed apart from each other, and the circumferential edge portions of the discharge electrodes EA and EB are in close proximity to each other. The plasma P is generated in a discharge region D that is located in a gap between the discharge electrodes EA and EB, in which the circumferential edge portions of the discharge electrodes EA and EB come closest to each other.

The chamber 11 includes a container CA in which the liquid-phase plasma raw material SA is stored and a container CB in which the liquid-phase plasma raw material SB is stored. The containers CA and CB are supplied with heated, liquid-phase plasma raw materials SA and SB, respectively. The liquid-phase plasma raw materials SA, SB are, for example, tin (Sn); however, they may also be lithium (Li).

The container CA houses the plasma raw material SA such that the lower part of the discharge electrode EA is immersed in the liquid-phase plasma raw material SA. The container CB houses the plasma raw material SB such that the lower part of the discharge electrode EB is immersed in the liquid-phase plasma raw material SB. Hence, the liquid-phase plasma raw materials SA and SB adhere to the lower parts of the discharge electrodes EA and EB. The liquid-phase plasma raw materials SA and SB, which has adhered to the lower parts of the discharge electrodes EA and EB, are transported to the discharge region D where the plasma P is generated when the discharge electrodes EA and EB rotate.

The discharge electrode EA is coupled to a rotation shaft JA of a motor MA and rotates around an axis of the discharge electrode EA. The discharge electrode EB is coupled to a rotation shaft JB of a motor MB and rotates around an axis of the discharge electrode EB. The motors MA and MB are disposed outside the chamber 11, and have their rotation shafts JA and JB extending from the outside to the inside of the chamber 11, respectively. The gap between the rotation shaft JA and a wall of the chamber 11 is sealed with a seal member PA, and the gap between the rotation shaft JB and a wall of the chamber 11 is sealed with a seal member PB. The seal members PA, PB are, for example, mechanical seals. The seal members PA, PB rotatably supports the rotation shafts JA, JB respectively while maintaining the reduced-pressure atmosphere in the chamber 11.

The EUV light source apparatus 1 further includes a controller 12, a pulse power supply unit 13, a laser source (energy beam irradiation device) 14, and a movable mirror 16. The controller 12, the pulse power supply unit 13, the laser source 14, and the movable mirror 16 are mounted outside the chamber 11. The controller 12 controls the operation of each section of the EUV light source apparatus 1, as will be described below. For example, the controller 12 controls the rotation drive of the motors MA and MB to rotate the discharge electrodes EA and EB at a predetermined rotation speed. The controller 12 also controls the operation of the pulse power supply unit 13, the irradiation timing of the laser beam LB from the laser source 14, and the like.

The containers CA and CB, which are located inside the chamber 11, are connected with two power feed lines QA and QB extending from the pulse power supply unit 13 and passing through feedthrough FA and FB, respectively. The feedthrough FA and FB are seal members that are embedded in the walls of the chamber 11 to maintain a reduced-pressure atmosphere in the chamber 11. The containers CA and CB are formed from conductive materials, and the plasma raw materials SA and SB housed inside the containers CA and CB are also conductive materials such as tin. The lower parts of the discharge electrodes EA and EB are immersed in the plasma raw materials SA and SB contained inside the containers CA and CB, respectively. Hence, when the pulse power supply unit 13 supplies pulse power to the containers CA and CB, the pulse power is supplied to the discharge electrodes EA and EB through the plasma raw materials SA and SB, respectively, The pulse power supply unit 13 supplies the pulse power to the discharge electrodes EA, EB to generate an electric discharge in the discharge region D. The plasma raw materials SA and SB that have been transported to the discharge region D by the rotation of the respective discharge electrodes EA and EB are heated and excited by the current flowing between the discharge electrodes EA and EB during discharge, thereby generating the plasma P that emits EUV light.

The laser source 14 irradiates the plasma raw material SA that has adhered to the discharge electrode EA and has been transported to the discharge region D with the energy beam to vaporize the plasma raw material SA. The laser source 14 is, for example, a Nd:YVO$_4$ (Neodymium-doped Yttrium Orthovanadate) laser system. Then, the laser source 14 emits the laser beam LB in the infrared region having a wavelength of 1064 nm. However, the energy beam irradiation device may be a device that emits an energy beam other than the laser beam LB, provided that it enables vaporization of the plasma raw material SA.

The laser beam LB emitted from the laser source 14 is guided to the movable mirror 16 via a condensing means including, for example, a condensing lens 15. The condensing means adjusts a spot diameter of the laser beam LB at a laser beam irradiation position of the discharge electrode EA. The condensing lens 15 and the movable mirror 16 are disposed outside the chamber 11.

The laser beam LB focused by the condensing lens 15 is reflected by the movable mirror 16, passes through a transparent window 20 provided in a side wall 11a of the chamber 11, and is irradiated onto the circumferential edge portion of the discharge electrode EA near the discharge region D. The position at which the laser beam LB is irradiated onto the discharge electrode EA is adjusted by adjusting the posture of the movable mirror 16. The adjustment of the posture of the movable mirror 16 may be manually performed by an operator, or the controller 12 may control the posture of the movable mirror 16 based on the intensity information of EUV light from a monitoring device 43 to be described below. In this case, the movable mirror 16 is driven by a movable mirror drive unit, which is not shown in the figure.

In order to facilitate the irradiation of the laser beam LB onto the circumferential edge portion of the discharge electrode EA near the discharge region D, the axes of the discharge electrodes EA and EB are not aligned in parallel. The spacing between the rotation shafts JA, JB is narrower on the side of the motor MA, MB and wider on the side of the discharge electrodes EA, EB. This configuration allows the facing surfaces of the discharge electrodes EA and EB to be placed closer together while the opposite side of the facing surfaces of the discharge electrodes EA and EB is retreated from the irradiation path of the laser beam LB, making it easier to irradiate the circumferential edge portion of the discharge electrode EA near the discharge region D with the laser beam LB.

The discharge electrode EB is disposed between the discharge electrode EA and the movable mirror 16. The laser beam LB reflected by the movable mirror 16 passes near the outer circumferential surface of the discharge electrode EB and then reaches the outer circumferential surface of the discharge electrode EA. At this time, to prevent the laser beam LB from being blocked by the discharge electrode EB, the discharge electrode EB is retreated to the direction of the motor MB side (left side of FIG. 1) from the discharge electrode EA. The liquid-phase plasma raw material SA that has adhered to the outer circumferential surface of the discharge electrode EA near the discharge region D is vaporized by the laser beam LB irradiation and supplied to the discharge region D as gas-phase plasma raw material SA.

The pulse power supply unit 13 supplies power to the discharge electrodes EA and EB to generate the plasma P in the discharge region D (to convert the gas-phase plasma raw material SA into plasma). When the gas-phase plasma raw material SA is supplied to the discharge region D by the laser beam LB irradiation, the discharge occurs between the discharge electrodes EA, EB in the discharge region D. The discharge occurring between the discharge electrodes EA and EB heats and excites the gas-phase plasma raw material SA in the discharge region D with its electric current, generating the plasma P. The generated plasma P emits EUV light, and the EUV light enters the debris capture section 3 through a first window 17, which is a through hole provided in the side wall 11b of the chamber 11.

Debris Capture Section

The debris capture section 3 includes a connection chamber 21 located on a side wall 11b of the chamber 11. The connection chamber 21 is a vacuum enclosure made of a rigid body, e.g., metal, and its interior is maintained in a reduced-pressure atmosphere below a predetermined pressure to suppress the attenuation of the EUV light, as similar to the chamber 11. The connection chamber 21 is connected between the chamber 11 and the utilization device 42 (see FIG. 2).

The internal space of the connection chamber 21 communicates with the chamber 11 through the first window 17. The connection chamber 21 includes a second window 27 as a light extraction section that introduces EUV light entering from the first window 17 to the utilization device 42 (e.g., mask inspection system). The second window 27 is a through hole of a predetermined shape formed in a side wall 21a of the connection chamber 21.

Meanwhile, the plasma P releases debris DB (see FIG. 2) at high speed in various directions along with EUV light. The debris DB includes particles of tin, which are the plasma raw materials SA and SB, and particles of material of the discharge electrodes EA and EB, which are sputtered with the generation of plasma P. The debris DB obtains a large amount of kinetic energy through the contraction and expansion process of the plasma P. In other words, the debris DB generated from the plasma P contains ions, neutral particles, and electrons moving at high speed. When such debris DB reaches the utilization device 42, it may damage or contaminate reflective films of optical elements disposed in the utilization device 42, degrading its performance.

Hence, the debris capture section 3 includes a rotary foil trap 22 (equivalent to the foil trap of the present embodiment) and a fixed foil trap 24 to prevent debris DB from entering the utilization device 42. The rotary foil trap 22 and the fixed foil trap 24 are disposed inside the connection chamber 21. The fixed foil trap 24 is mounted between the rotary foil trap 22 and the utilization device 24 on the optical path of the EUV light traveling from the connection chamber 21 to the utilization device 42. The one debris capture section 3 may be provided with both the rotary foil trap 22 and the fixed foil trap 24, or either one of them.

Figure 3:
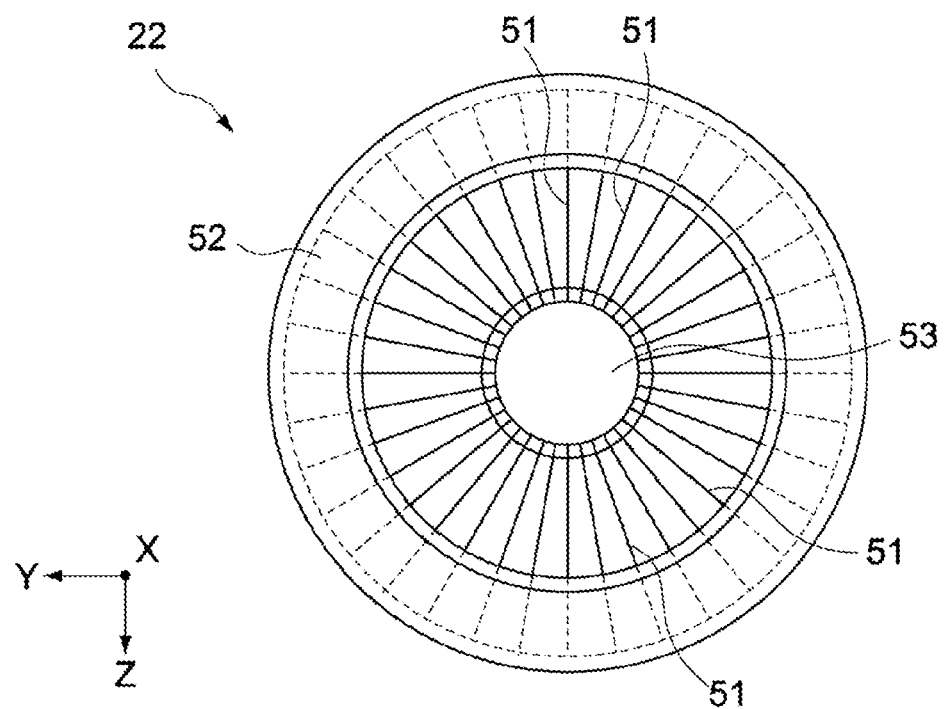
FIG. 3 is a front view of an example of the configuration of a rotary foil trap.

FIG. 3 is a front view of an example of the configuration of the rotary foil trap 22 in FIG. 2.

In FIG. 3, the rotary foil trap 22 includes a plurality of foils (blades) 51, an outer ring 52, and a central pillar 53. The outer ring 52 is concentric to the central pillar 53, and each foil 51 is disposed between the outer ring 52 and the central pillar 53. Here, each foil 51 is a thin film or a thin flat plate. Each foil 51 is arranged radially with approximately equal angular spacing. Each foil 51 is arranged on a plane containing a central axis line JM (see FIG. 2) of the central pillar 53. The material of the rotary foil trap 22 is a high-melting-point metal such as tungsten (W) or molybdenum (Mo).

A plurality of the foils 51 of the rotary foil trap 22 are arranged parallel to the beam direction of the EUV light traveling toward the second window 27 to avoid blocking the EUV light traveling from the plasma P (emission point) toward the second window 27. In other words, as shown in FIG. 2, the rotary foil trap 22, in which each foil 51 is arranged on a plane containing the central axis line JM of the central pillar 53, is disposed such that the plasma P (emission point) is present along the extension of the central axis line JM of the central pillar 53. This configuration blocks the EUV light only by the thickness of each foil 51, except for the central pillar 53 and the outer ring 52, thus maximizing the proportion (also called transmittance) of EUV light that passes through the rotary foil trap 22.

The central pillar 53 is coupled to a rotation shaft JC of a motor (rotation drive device) MC as shown in FIG. 2, and the central axis line JM of the central pillar 53 aligns with the central axis of the rotation shaft JC. The rotation shaft JC of the motor MC is regarded as the rotation shaft of the rotary foil trap 22. The rotary foil trap 22 is driven by the motor MC to rotate, and the rotating foil 51 collides with the debris DB coming from the plasma P, traps the debris DB and prevents the debris DB from entering the utilization device 42. The central pillar 53 will be described in detail later.

The rotary foil trap 22 is disposed inside the connection chamber 21, whereas the motor MC is disposed outside the connection chamber 21. The side wall 21a of the connection chamber 21 has a through hole through which the rotation shaft JC passes. The space between the rotation shaft JC and the side wall 21a of the connection chamber 21 is sealed with a seal member PC, for example, a mechanical seal. The seal member PC rotatably supports the rotation shaft JC of the motor MC while maintaining a reduced-pressure atmosphere in the connection chamber 21.

The rotary foil trap 22 is subject to high-temperatures due to radiation from the plasma P. To prevent the overheating of the rotary foil trap 22, the rotation shaft JC is provided with a cooling mechanism. As the cooling mechanism, for example, the rotation shaft JC is hollowed out to form a circulation passage for cooling water or other refrigerant. Circulating refrigerant through this circulation passage enables the cooling of the rotary foil trap 22, which is connected to the rotation shaft JC. Since the motor MC itself also generates heat during rotation, a cooling water piping 41 may be wrapped around the motor MC to remove heat. Cooling water is supplied to the cooling water piping 41 to cool the motor MC through heat exchange.

In addition, in order to reduce the radiation from the plasma P to the rotary foil trap 22 and to prevent the overheating of the rotary foil trap 22, the connection chamber 21 is provided with a heat shield plate 23 between the first window 17 and the rotary foil trap 22. The heat shield plate 23 corresponds to an aperture having an opening KA with an arbitrary shape (e.g., circular) for extracting a portion of the EUV light emitted from the plasma P. The heat shield plate 23 is made of a high-melting-point material such as molybdenum or tungsten because it is disposed in the vicinity of the plasma P.

The opening KA is provided at a position eccentrically located from the rotation axis JM of the rotary foil trap 22. Then, a part of the EUV light emitted from the plasma P is extracted through the opening KA of the heat shield plate 23 at a predetermined solid angle with an inclination angle with respect to the direction of the rotation axis of the rotary foil trap 22 (transverse direction in FIG. 2). The rotary foil trap 22 is disposed such that the foil 51 is positioned on a principal ray UL of the EUV light beam flux (hereinafter referred to as EUV extraction light) that has passed through the opening KA of the heat shield plate 23. The EUV light that has been extracted from the opening KA of the heat shield plate 23 passes through the debris capture section 3 and is introduced into the utilization device (mask inspection system) 42 through the second window 27.

The rotary foil trap 22 captures relatively low-speed debris DB among the debris DB released from the plasma P. In contrast, the fixed foil trap 24 captures debris DB that travels at high speed and is unable to be captured by the rotary foil trap 2 among the debris DB released from the plasma P. As shown in FIG. 2, the fixed foil trap 24 is disposed on the principal ray UL of the EUV extraction light. The fixed foil trap 24 has a shape corresponding to the region through which the EUV extraction light, which is EUV light whose traveling direction is restricted by the opening KA of the heat shield plate 23, passes.

Figure 4:
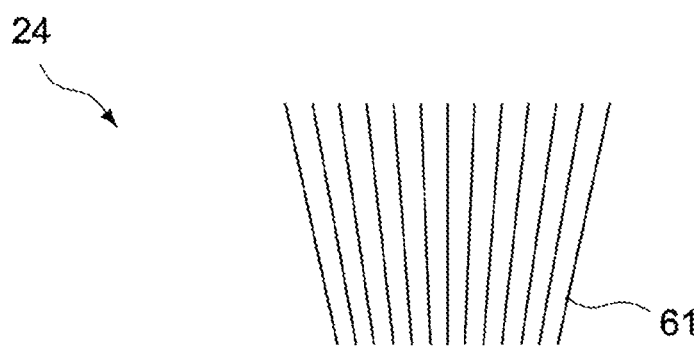
FIG. 4 is a top view of an example of the configuration of a fixed foil trap.
Figure 5:
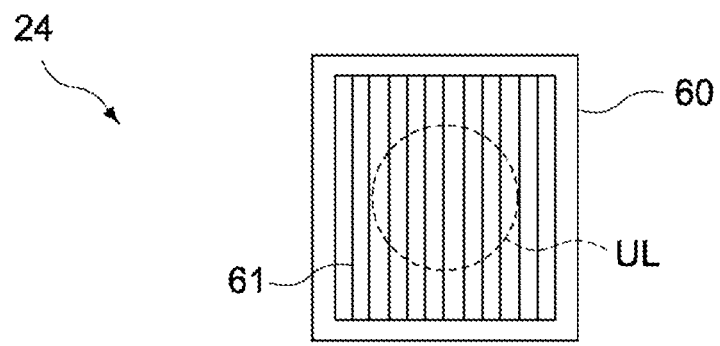
FIG. 5 is a cross-sectional view of the above fixed foil trap.

FIG. 4 is a top view of an example of the configuration of the fixed foil trap 24 of FIG. 2, and FIG. 5 is a cross-sectional view thereof.

In FIGS. 4 and 5, the fixed foil trap 24 is provided with a plurality of foils 61 and a fixed frame (fixed member) 60 that supports the foils 61. As shown in FIG. 5, the foils 61 are arranged at equal intervals in the cross-section orthogonal to the principal ray UL direction of the EUV extraction light. The fixed frame 60 has, for example, a rectangle shape when viewed from the front. The fixed frame 60 may have any external shape. In addition, a plurality of the foils 61 are radially arranged to extend toward the beam direction of the EUV extraction light when viewed from a direction orthogonal to the principal ray UL direction, as shown in FIG. 4.

By dividing the space in which the fixed foil trap 24 is disposed into smaller parts, a plurality of the foils 61 of the fixed foil trap 24 serve to lower the conductance in those parts and increase the pressure locally. In addition, the pressure in the fixed foil trap 24 is increased by appropriately supplying gas to the fixed foil trap 24. In other words, the gas is made to be localized in the fixed foil trap 24 to provide a relatively high pressure area in the connection chamber 21. The gas supplied to the fixed foil trap 24 is preferably a gas with high transmittance to EUV light, including noble gases such as helium (He) and argon (Ar), or hydrogen ($H_2$).

The high-speed debris DB, which has failed to be captured in the rotary foil trap 22, slows down because a collision probability with the gas is increased in the region of higher pressure in the fixed foil trap 24. The collision with the gas also alters the traveling direction of the debris DB. The fixed foil trap 24 captures the debris DB that has thus slowed down and altered its traveling direction with the foils 61 or fixed frame 60.

As shown in FIG. 2, a cover 25 is disposed in the connection chamber 21. The cover 25 encircles the rotary foil trap 22 and constitutes a foil trap cover device that prevents debris DB captured by the rotary foil trap 22 from being scattered inside the connection chamber 21. The cover 25 has an incident side opening KI and exit side openings KOA, KOB. The incident side opening KI is provided at a position at which the EUV light entering the rotary foil trap 22 is not blocked. The exit side opening KOA is provided at a position at which EUV light passing through the incident side opening KI and the rotary foil trap 22 is not blocked to enter the fixed foil trap 24. The exit side opening KOB is provided at a position at which EUV light passing through the incident side opening KI and the rotary foil trap 22 is not blocked to enter a monitoring device 43.

At least a part of the debris DB captured by the rotary foil trap 22 is traveled in the radial direction on the foil 51 of the rotary foil trap 22 by centrifugal force, and is detached from the end portion of the foil 51, adhering to the inner surface of the cover 25. The cover 25 is heated by the heating means (cover heating section) omitted in FIGS. 1 and 2 or by secondary radiation from the heat shield plate 23 that is subject to EUV radiation. The debris DB adhering to the inner surface of the cover 25 does not solidify due to the heating and remains in the liquid phase. The debris DB adhering to the inner surface of the cover 25 collects at the bottom of the cover 25 due to gravity, and is discharged from the bottom of the cover 25 through a discharge pipe 26 to the outside of the cover 25 as waste material, which is stored in the debris container 4. Accordingly, the cover 25 prevents the debris DB, which is detached from the end portion of the foil (blade) 51 of the rotary foil trap 22, from scattering into the interior of the connection chamber 21.

In addition, the monitoring device 43 is disposed outside the connection chamber 21 to monitor the EUV light. The monitoring device 43 is a detector that detects EUV light or a measuring device that measures the intensity of EUV light. An EUV light guide hole 28, which is a through hole through which EUV light passes, is formed in the wall of the connection chamber 21. A guide tube 29 through which EUV light passes without leaking outside the connection chamber 21, is provided between the EUV light guide hole 28 and the monitoring device 43.

The heat shield plate 23 has an opening KB of any shape (e.g., circular) for extracting a portion of the EUV light emitted from the plasma P at a position different from the opening KA. The monitoring device 43, the EUV light guide hole 28, and the guide tube 29 are disposed along the extension of a straight line connecting the plasma P and the center of the opening KB. Hence, a part of the EUV light emitted from the plasma P passes sequentially through the first window 17 of the chamber 11, the opening KB of the heat shield plate 23, the incident side opening KI of the cover 25, the spaces between a plurality of the foils (blades) 51 of the rotary foil trap 22, the exit side opening KOB of the cover 25, the EUV light guide hole 28 in the wall of the connection chamber 21, and the inner space of the guide tube 29 to reach the monitoring device 43. In this manner, the EUV light can be monitored by the monitoring device 43.

Details of the Rotary Foil Trap

Figure 6:
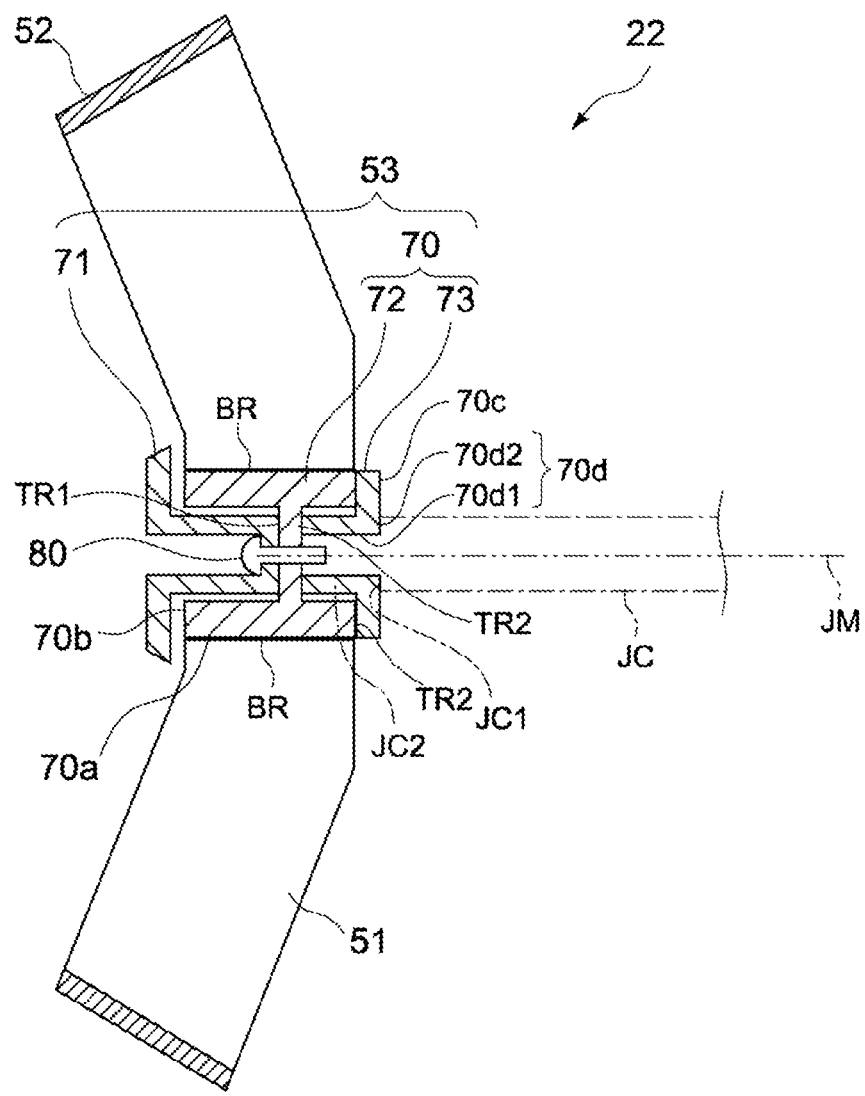
FIG. 6 is a side cross-sectional view of the foil trap of the present embodiment.
Figure 7:
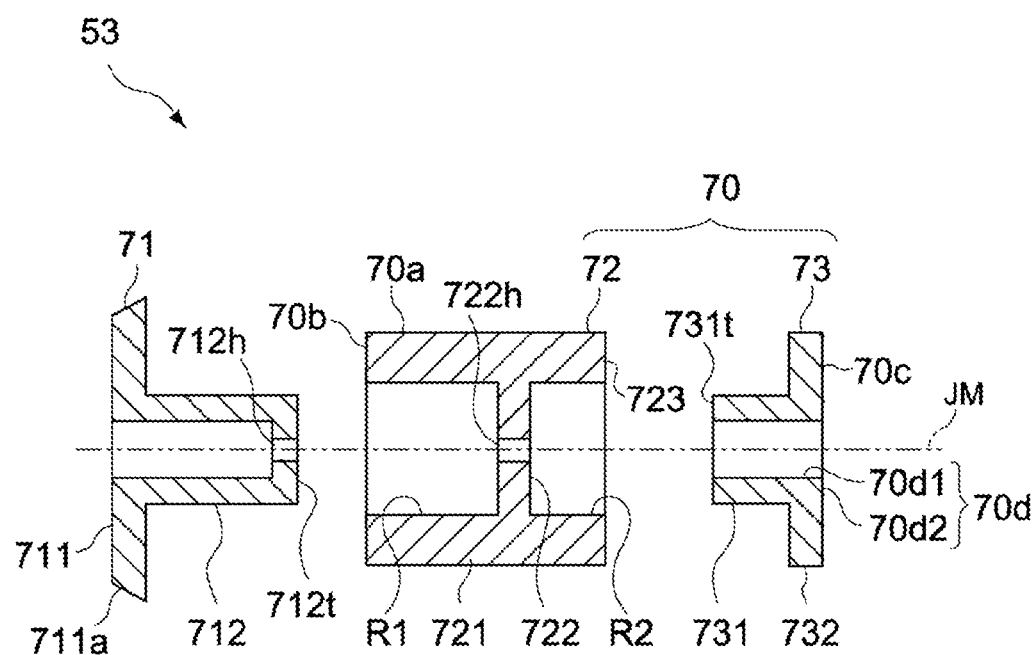
FIG. 7 is an exploded side cross-sectional view of the main section in FIG. 6.

The details of the central pillar 53 in the rotary foil trap 22 in the present embodiment will be described below. FIG. 6 is a side cross-sectional view of the rotary foil trap 22 and FIG. 7 is an exploded side cross-sectional view of the central pillar 53.

As described above, the rotary foil trap 22 includes a plurality of the foils 51, the outer ring 52, and the central pillar 53. The central pillar 53 has a rotationally symmetrical shape and includes a hub structure 70 and a shield member 71. The details of each part of the central pillar are described below.

Hub Structure

The hub structure 70 is connected to the front end portion of the rotation shaft JC in a coaxial manner (on the central axis line JM) with the rotation shaft JC. The hub structure 70 has a circumferential surface portion 70a that supports a plurality of the foils, a front surface portion 70b facing the plasma P, and a rear surface portion 70c opposite the front face 70b.

The circumferential surface portion 70a is a cylindrical surface concentric to the central axis line JM. The circumferential surface portion 70a supports each of a plurality of the foils 51 at its end on the central pillar 53 by brazing. The brazing material used is not particularly limited; however, for example, gold brazing, which has a relatively high melting point, is used. The brazed portion is not particularly limited; however, forming the brazed portion BR over the entire end of each foil 51 on the central pillar 53 side in the front-to-back direction ensures a desired joint strength of each foil 51 to the circumferential surface portion 70a.

The front surface portion 70b is covered from the plasma P with the shield member 71. The rear surface portion 70c has a fitting portion 70d that fits the rotation shaft JC. The front end portion of the rotation shaft JC has a front end shaft portion JC2 that has a reduced diameter through a step JC1. The fitting portion 70d includes a circular fitting hole 70d1 which the front end shaft portion JC2 fits, and a contact surface 70d2 that is provided at the circumferential edge portion of the fitting hole 70d1 and is in contact with the step JC1 of the rotation shaft JC in the axial direction. The contact surface 70d2, as shown in FIG. 6, is formed on the same plane as the rear surface portion 70c. The contact surface, however, is not limited to this profile; it may be an annular convex shape protruding from the rear surface portion 70c to the motor side, which is not shown in the figure, or an annular concave shape recessed into the rear surface portion 70c.

In the present embodiment, the hub structure 70 includes a connecting body of a hub body 72 and a shaft receptor 73. The hub body 72 is made of a high-melting-point metal material such as tungsten or molybdenum.

Hub Body

As shown in FIG. 7, the hub body 72 includes a cylindrical portion 721 that constitutes the circumferential surface portion 70a, and a partition wall 722 that divides the inside of the cylindrical portion 721 in the axial direction. By providing the partition wall 722 inside the hub body 72, a first recess R1 is formed on the side of the shield member 71 and a second recess R2 is formed on the side of the shaft receptor 73.

Shaft Receptor

As shown in FIG. 7, the shaft receptor 73 includes a cylindrical portion 731 that forms the fitting hole 70d1 and a disk-shaped flange 732 that forms the rear surface portion 70c. The shaft receptor 73 is made of a high-melting-point metal material such as tungsten or molybdenum.

The cylindrical portion 731 has an outer diameter that is smaller than the inner diameter of the cylindrical portion 721 of the hub body 72 and can fit inside the hub body 72. The cylindrical portion 731 is formed as a cylindrical convex portion (second convex portion) having the fitting portion 70d and a top portion 731t that faces the partition wall 722 of the hub body 72.

The length of the cylindrical portion 731 protruding from the flange 732 to the hub body 72 may be set to be approximately the same length as the depth of the second recess R2. In this case, when the shaft receptor 73 is coupled to the hub body 72, the top portion 731t of the cylindrical portion 731 is in contact with the partition wall 722, and the flange 73 is in contact with the end portion 723 on the side of the shaft receptor 73 of the hub body 72 (see FIG. 6). This configuration increases the contact area between the hub body 72 and the shaft receptor 73, enhancing the cooling effect of the hub body 72 with the refrigerant (cooling water) flowing inside the rotation shaft JC.

Shield Member

The shield member 71 is disposed on the front surface portion 70b of the hub structure 70. The shield member 71 includes a disk portion 711 that covers the front surface portion 70b of the hub structure 70 and a cylindrical portion 712 that protrudes from the center of the disk portion to the hub body 72. The shield member 71 is made of a high-melting-point metal material such as tungsten or molybdenum.

The disk portion 711 has a circumferential edge portion 711a that has an outer diameter larger than the outer diameter of the hub body 72. The circumferential edge portion 711a may have any outer diameter as long as the outer diameter thereof is large enough to shield the circumferential surface portion 70a of the hub structure 70 from the plasma P. This configuration prevents the brazed portion BR of the circumferential surface portion 70a of the hub body 72 from being thermally radiated from the heat shield plate 23. In addition, the rotary foil trap 22 having this configuration is also applicable to a light source apparatus for an exposure system that is not provided with the heat shield plate 23.

The cylindrical portion 712 has an outer diameter that is smaller than the inner diameter of the cylindrical portion 721 of the hub body 72, and can fit inside the hub body 72. The cylindrical portion 712 is formed as a cylindrical convex portion (first convex portion) having a bottom surface portion 712t that is connectable with the partition wall 722 of the hub body 72.

The length of the cylindrical portion 712 protruding from the disk portion 711 to the hub body 72 may be set to be approximately the same length as the depth of the first recess R1; however it may also be set to be longer than the depth of the first recess R1. By setting the above length of the cylindrical portion 712 larger than the depth of the first recess R1, when the shield member 71 is coupled to the hub body 72, the bottom surface portion 712t of the cylindrical portion 712 is able to be in contact with the partition wall 722, and the disk portion 711 is able to be spaced apart axially from the end portion (front surface portion 70b) of the hub body 72, which is adjacent to the shield member 71 (see FIG. 6).

This configuration reduces the contact area between the shield member 71 and the hub body 72 compared to the case where the disk portion 711 is in contact with the hub body 72 (front surface portion 70b), thus reducing the thermal conduction between the shield member 71 and the hub body 72. This configuration also enables the contact area between the shield member 71 and the hub body 72 to be smaller than the contact area between the hub body 72 and the shaft receptor 73, thus making it possible to have a difference in the thermal conduction between them. Furthermore, the contact area between the shield member 71 and the hub body 72 is set to be smaller than the contact area between the shaft receptor 73 and the rotation shaft JC. This configuration enables the thermal conduction between the shield member 71 and the hub body 72 to be lower than the thermal conduction between the shaft receptor 73 (hub body 72) and the rotation shaft JC.

Fastening Member

The central pillar 53 is further provided with a fastening member 80 that fixes the hub structure 70 (hub body 72 and shaft receptor 73) and the shield member 71 to the front end portion of the rotation shaft JC. The fastening member 80 is composed of a fastener such as a screw member inserted into the hub structure 70 from the side of the shield member 71, as shown in FIG. 6. The fastening member 80 penetrates through an insertion hole 712h (see FIG. 7) formed in the center of the bottom surface portion of the shield member 71 and an insertion hole 722h (see FIG. 7) formed in the center of the partition wall 722 of the hub body 72, and screws into the front end portion of the rotation shaft JC to integrally fix the hub structure 70 and shield member 71 to the rotation shaft JC.

Comparative Example

Figure 8:
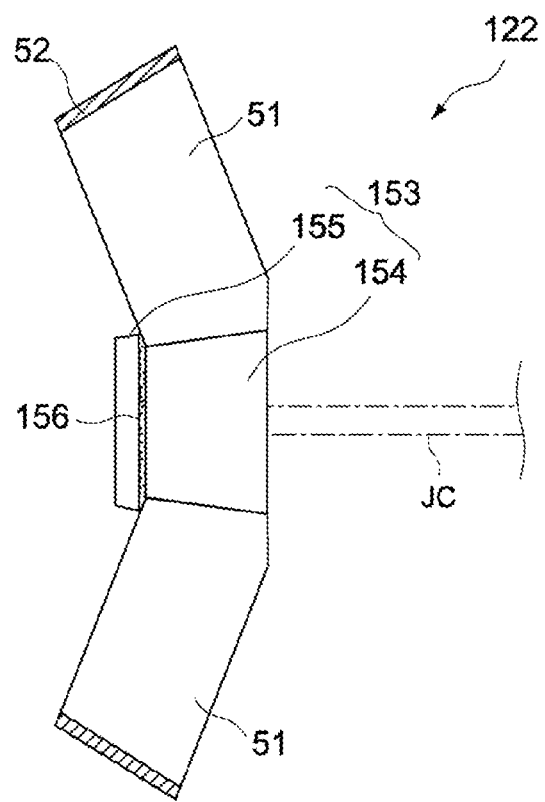
FIG. 8 is a side view of a rotary foil trap for a comparative example.

FIG. 8 is a side view of a rotary foil trap 122 for a comparative example. The rotary foil trap 122 is provided with a central pillar 153 that supports a plurality of foils 51. The central pillar 153 includes a hub 154, a shield member 155 disposed in front of the hub 154, and an intermediate member 156 that joins the hub 154 and the shield member 155.

In the rotary foil trap 122 of this structure, the hub 154 and the shield member 155 are made of a high-melting-point metal material such as tungsten or molybdenum. In contrast, the intermediate member 156 is made of a softer material than the material that constitutes the hub 154 and shield member 155. Providing the intermediate member 156 between the hub 154 and the shield member 155 improves the thermal conduction from the shield member 155 to the hub 154, thus enhancing the cooling effect of the shield member by the rotation shaft JC that is provided with a cooling mechanism.

The foil trap 122, which improves the cooling effect of the shield member 155 in this manner, is advantageous in that it effectively cools the shield member 155, which receives heat load from the plasma, when applied to a light source apparatus for an exposure system that is not provided with a heat shield plate 23. However, when the rotary foil trap 122 is applied to a light source apparatus for an inspection system, such as the present embodiment, the heat load on the shield member received from the plasma is reduced by the heat shield effect of the heat shield plate 23, compared to a light source apparatus for an exposure system. Hence, the cooling mechanism of the hub 154 may cause the temperature of the shield member 155 to drop too low, to a temperature lower than the melting point of the debris. In this case, when the debris (Sn) in a molten state captured by a plurality of the foils 51 adheres to the shield member 155, the debris is deposited on the shield member 155. Then, since the deposited debris increases the mass of the foil trap, the load on the motor that drives the rotary foil trap increases and may cause failure, or the rotation speed of the motor fails to be stabilized without adjusting the control parameters. Therefore, the temperature of the shield member 155 is necessary to be maintained at a temperature above the melting point of the debris.

Meanwhile, in order to solve the above problem, it is possible to avoid the excessive cooling of the shield member 155 by reducing the amount of refrigerant circulating for cooling the hub 154 compared to the case in which it is applied to a light source apparatus for an exposure system. However, in this case, the cooling effect of the hub 154 and each foil 51 is also reduced as well as the shield member 155. Hence, another problem arises, in which it becomes difficult to maintain the temperature of each foil 51, where the heat load received from the plasma is greater than that of the shield member 155, at a temperature that does not cause such defects that the temperature of its brazed portion reaches above the melting point of the brazing material.

Effect of the Present Embodiment

On the other hand, in the rotary foil trap 22 of the present embodiment, since the shield member 71 is directly in contact with the hub body 72 without a soft material such as the intermediate member 156 in the comparative example, a thermal resistance section TR1 (see FIG. 6) can be formed between the shield member 71 and the hub body 72. This thermal resistance portion TR1 is specifically the contact layer between the bottom surface portion 712t of the shield member 71 and the partition wall 722 of the hub body 72. This contact layer corresponds to the contact interface surface between the bottom surface portion 712t and the partition wall 722.

The characteristics of thermal conduction at the above-mentioned contact interface surface are significantly influenced by the surface properties of each surface that constitutes the interface. For example, as the surface roughness becomes larger, the contact area at the interface becomes smaller, and thus the thermal resistance becomes larger, whereby the thermal conductivity tends to decrease. The intermediate member 156 in the comparative example is intended to enhance the adhesion between the shield member and the hub without being affected by such surface properties of the contact interface surface. In the rotary foil trap 22 of the present embodiment, which is not provided with such a member, a thermal resistance layer is formed between the shield member 71 and the hub body 72 in accordance with the surface properties of the contact interface surface between them.

Hence, according to the present embodiment, the thermal resistance section TR1 causes poor thermal conduction between the shield member 71 and the hub body 72, and thus the shield member 71 is less likely to be cooled by the cooling action of the hub body 72 (hub structure 70), thus preventing the shield member 71 from being excessively cooled. This configuration enables the temperature of the shield member 71 to be maintained at a temperature above the melting point of debris DB, thus preventing the debris DB from being deposited on the shield member 71.

In addition, according to this embodiment, this configuration prevents excessive cooling of the shield member 71 due to the cooling action of the hub body 72, thus eliminating the need for adjusting the cooling characteristics of the hub body 72 (hub structure 70). This configuration enables the hub body 72 to be maintained at a temperature that is normally necessary for cooling, thus preventing the temperature of the brazed portion BR from rising due to insufficient cooling, and maintaining the hub body 72 at a temperature that does not cause such defects that the brazed portion BR reaches a temperature higher than its melting point.

Moreover, in the present embodiment, since the contact area between the hub structure 70 (shaft receptor 73) and the front end portion of the rotation shaft MC is larger than the contact area between the hub structure 70 (hub body 72) and the shield member 71, the thermal conduction between the shield member 71 and the hub body 72 is able to be lower than that between the shaft receptor 73 (hub body 72) and the rotation shaft JC. This configuration makes it possible to stably maintain a state in which the heat dissipation from the hub structure 70 to the rotation shaft MC is higher than the heat input from the shield member 71 to the hub structure 70, thereby preventing the excessive cooling of the shield member 71 while ensuring stable cooling of the hub body 70. For example, the contact area between the shield member 71 and the hub body 72 is easily able to be adjusted by the diameter of the cylindrical portion 712 of the shield member 71 and the size of the gap between the disk portion 711 and the hub body 72.

Furthermore, in the present embodiment, since the hub structure 70 has a split structure of the hub body 72 and the shaft receptor 73, the following effects are obtained.

Firstly, this configuration forms a thermal resistance section TR2 (see FIG. 6) between the hub body 72 and the shaft receptor 73. The thermal resistance section TR2 is formed in the contact layer (contact interface surface) between the partition wall 722 of the hub body 72 and the top portion 731t of the cylindrical portion 731 of the shaft receptor 73, and in the contact layer (contact interface surface) between the end 723 of the hub body 72 on the side of the shaft receptor 73 and the flange 732 of the shaft receptor 73. In this way, forming the thermal resistance section TR2 between the hub body 72 and the shaft receptor 73 prevents each foil 51 supported by the hub body 72 from being excessively cooled to a temperature equal to or below the melting point of debris due to the cooling mechanism of the rotation shaft JC.

Secondly, this configuration enables the central pillar 53 to be easily assembled to the rotation shaft JC. In the case in which the hub structure 70 has a split structure of the hub body 72 and the shaft receptor 73, as in the present embodiment, the connecting body of the shield member 71 and the hub body 72 is coupled to the shaft receptor 73 after the shaft receptor 73 is fitted to the front end portion of the rotation shaft JC. Then, this configuration makes it easy to align the axial centers of the respective shield member 71, hub body 72, and shaft receptor 73 with respect to the rotation shaft JC, thus facilitating the work of fixing each member to the rotation shaft JC with the fastening member 80.

Second Embodiment

Figure 9:
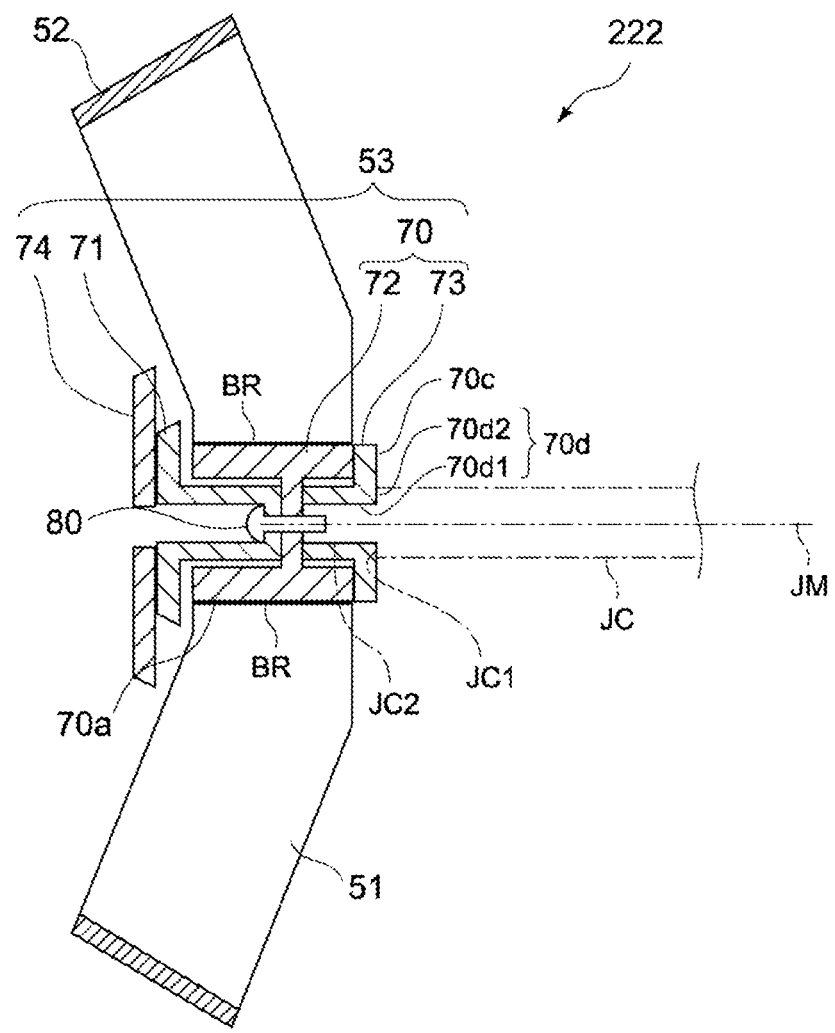
FIG. 9 is a side cross-sectional view of a foil trap in accordance with a second embodiment of the present invention.
Figure 10:
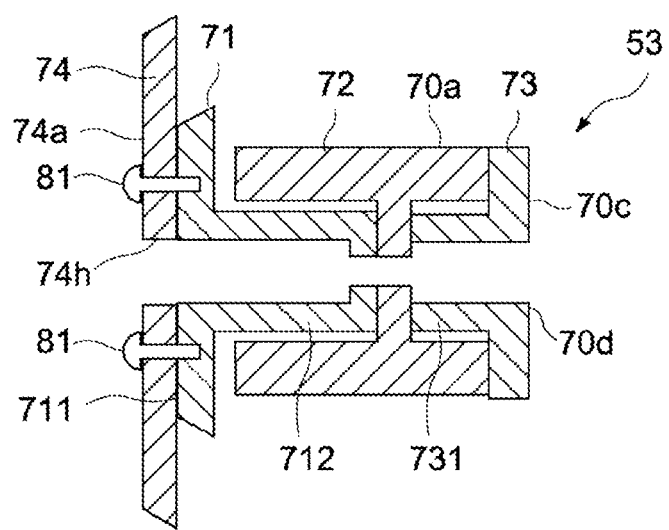
FIG. 10 is a side cross-sectional view of the main section of the foil trap shown in FIG. 9.

FIG. 9 is a side cross-sectional view of a foil trap 222 in accordance with a second embodiment of the present invention. FIG. 10 is a side cross-sectional view of the main section of the foil trap 222. Hereinafter, the configurations that differ from the first embodiment will be mainly described, and configurations that are similar to those of the first embodiment will be assigned a similar symbol to omit or simplify the description.

The foil trap 222 of the present embodiment is configured as a rotary foil trap as in the first embodiment. The present embodiment differs from the first embodiment in that the central pillar 53 is further provided with an extended shield member 74 in addition to the shield member 71, the hub body 72, and the shaft receptor 73.

In the rotary foil trap used in the EUV light source apparatuses for exposure systems, among EUV light emitted from the high-temperature plasma, the EUV light incident on the rotary foil trap is expected to be used for exposure as efficiently as possible, except the EUV light incident on the central pillar (hub). Hence, the shield member, which shields the brazed portion connecting the central pillar (hub) to the foil from debris flying from the high-temperature plasma and radiation from the high-temperature plasma, is set to minimize the amount of EUV light to be blocked to avoid reducing the utilization efficiency of EUV light as much as possible.

Meanwhile, when the EUV light source apparatus is used as a light source for inspection systems as shown in FIG. 1, the EUV extraction light travels along the principal ray UL that is away from the central axis line JM as shown in FIG. 2. Hence, the shield member 71 is able to expand its surface facing the heat shield plate 23 to the extent that it does not block EUV light traveling in the direction of the principal ray UL. Therefore, in the rotary foil trap 222 of the present embodiment, provided is an extended shield member 74 having a larger area than the region occupied by the surface of the shield member 71 facing the heat shield plate 23 (facing face), as shown in FIG. 9.

As shown in FIGS. 9 and 10, the extended shield member 74 is fixed using a plurality of fasteners 81 to the facing surface of the shield member 71 that faces the plasma (heat shield plate 23 in the present embodiment). The facing surface refers to a surface (front surface) in the disk portion 711 of the shield member 71, the surface being on the opposite side of the hub body 72. The extended shield member 74 has a surface portion 74a that has an area larger than the area of the above facing surface.

The extended shield member 74 is made of a high-melting-point material such as tungsten or molybdenum, similar to the shield member 71. The extended shield member 74 is a disk shape and has a through hole 74h in its center. This configuration makes it easier to insert the fastening member 80 from the side of the extended shield member 74, thereby enabling the extended shield member 74 to be fixed to the rotation shaft JC together with the hub body 72 in a state of the extended shield member 74 being fixed to the shield member 71.

In the present embodiment, which is configured as described above, it is possible to shield a wider area of thermal radiation from the heat shield plate 23 that is incident on the brazed portion BR of the hub body 72 that constitutes the hub structure 70 and the foil 51. In addition, adding one more component to the central pillar 53 increases the thermal resistance between the extended shield member 74 and the hub body 72, making it possible to reduce the thermal conduction from the side of the shield member 71 to the hub body 72 and the shaft receptor 73 of the rotation shaft.

Third Embodiment

Figure 11:
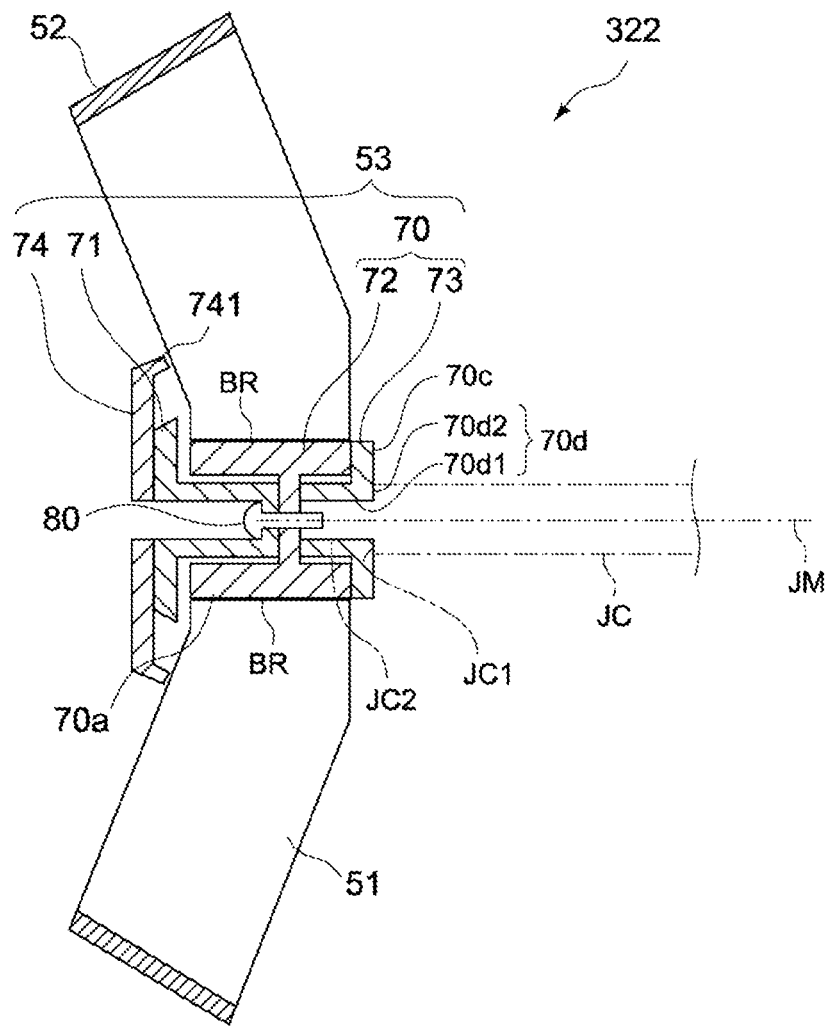
FIG. 11 is a side cross-sectional view of a foil trap in accordance with a third embodiment of the present invention.
Figure 12:
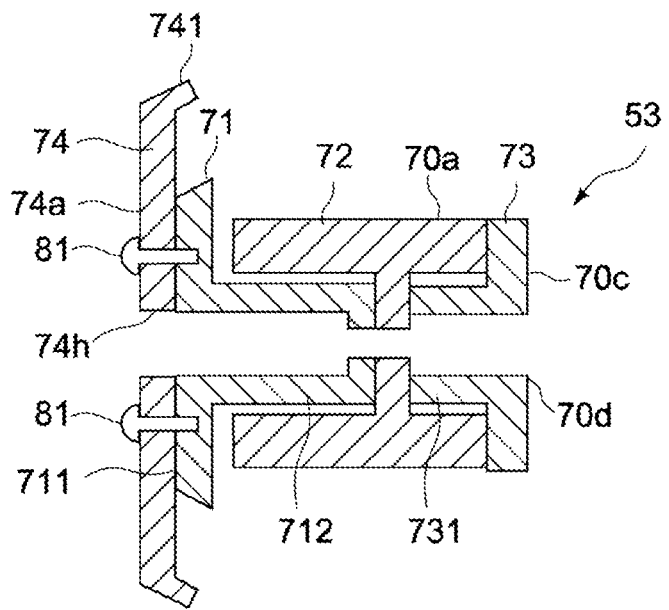
FIG. 12 is a side cross-sectional view of the main section of the foil trap shown in FIG. 11.

FIG. 11 is a side cross-sectional view of a foil trap 322 in accordance with a third embodiment of the present invention. FIG. 12 is a side cross-sectional view of the main section of the foil trap 322. Hereinafter, the configurations that differ from the second embodiment will be mainly described, and configurations that are similar to those of the second embodiment will be assigned a similar symbol to omit or simplify the description.

The present embodiment has in common with the second embodiment that an extended shield member 74 is provided in front of the shield member 71, but differs from the second embodiment in that the extended shield member 74 has a bent portion 741 at its end bent toward the foil 51.

Debris (tin) released from the high-temperature plasma first reaches and deposits on the surface of the heat shield plate 23, but some of the above released debris (tin) passes through the openings KA and KB (see FIG. 2) and reaches the rotary foil trap. When a part of the debris reaches the brazed portion BR between the hub body 72 of the hub structure 70 and the foil 51, the tin reacts with the brazed portion, causing the brazed portion BR to deteriorate. Here, providing the bent portion 741 on the extended shield member 74 reduces the gap between the extended shield member 74 and the end face of the foil 51. This configuration reduces the amount of tin (debris) that reaches the brazed portion, thus suppressing the deterioration of the brazed portion BR.

The bent portion 741 may be formed annularly over the entire circumferential edge portion of the extended shield member 74, may be formed only in part of regions of the circumferential edge portion of the extended shield member 74, or may be provided in multiple locations on the circumferential edge portion of the extended shield member 74.

Fourth Embodiment

Figure 13:
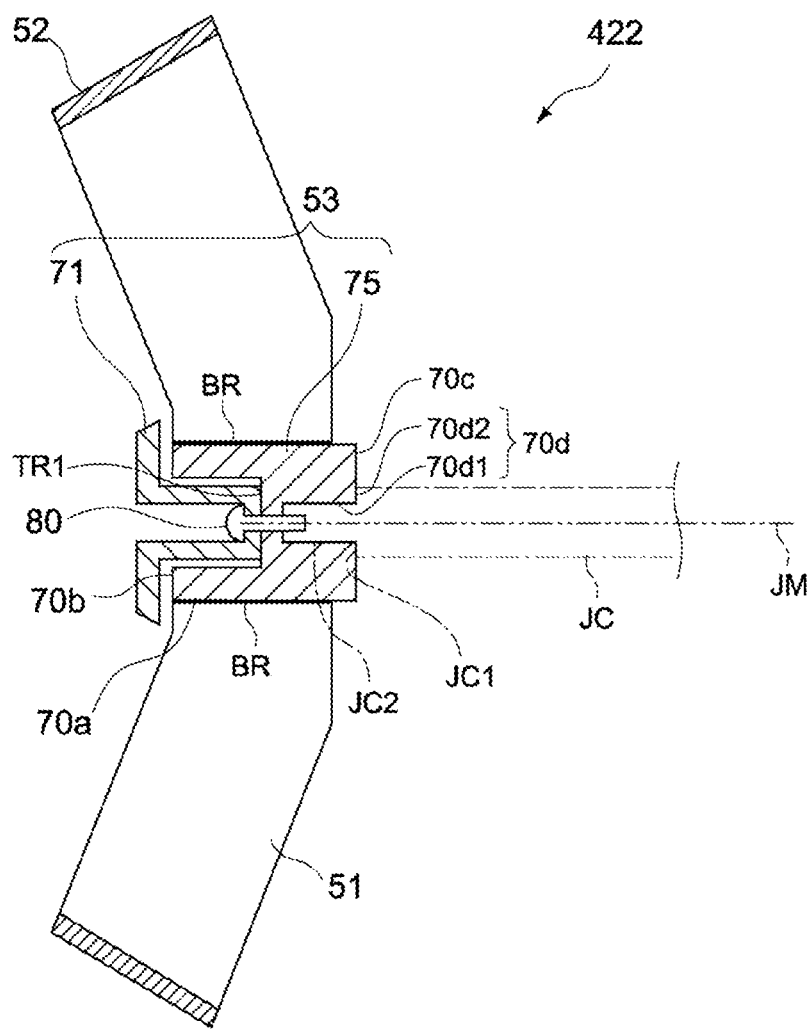
FIG. 13 is a side cross-sectional view of a foil trap in accordance with a fourth embodiment of the present invention.

FIG. 13 is a side cross-sectional view of a foil trap 422 in accordance with a fourth embodiment of the present invention. Hereinafter, the configurations that differ from the first embodiment will be mainly described, and configurations that are similar to those of the first embodiment will be assigned a similar symbol to omit or simplify the description.

The present embodiment differs from the first embodiment in that a hub structure 75 is configured with a single hub member having a circumferential surface portion 70a, a front surface portion 70b, and a rear surface portion 70c. In the present embodiment, the hub body 72 and the shaft receptor 73 in the first embodiment are integrated into one body.

Configuring the hub structure 75 with a single member as in the present embodiment eliminates the thermal resistance section TR2 (see FIG. 6) as in the first embodiment, thereby enhancing the cooling efficiency of the circumferential surface portion 70a of the hub structure 75 while preventing the excessive cooling of the shield member 71. In addition, this configuration sufficiently cools the brazed portion BR connecting the foil 51 on the circumferential surface portion 70a even when the cooling capacity of the cooling mechanism of the rotation shaft JC is relatively low. Such a configuration is applicable in an operating environment where high-performance specifications are unnecessary for the cooling mechanism.

Even in the present embodiment, the extended shield member 74 described in the above second and third embodiments may be applicable in the same manner.

Modification Example

The present invention has been shown and described with reference to the above-mentioned embodiments thereof. However, it will be understood by those skilled in the art that various changes in form and details may be made therein without departing from the scope of the invention as defined by the claims. Such variations, alterations, and modifications are intended to be encompassed in the scope of the present invention.

For example, the above-mentioned embodiments describe an example in which the present invention is applied to light source apparatuses for inspection systems; however the present invention is not limited to these systems, and can also be applied to light source apparatuses for exposure systems. In this case, for example, adopting the configuration of the second and third embodiments reduces the heat load transferred from the plasma P to the hub body 72 further.

In addition, in each of the above embodiments, the thermal resistance section TR1 is formed only at the contact interface surface between the shield member 71 and the hub body 72; however the present invention is not limited thereto. The thermal resistance section TR1 may be formed by interposing any member, for example, a ceramic plate, having heat insulating properties, between them. This configuration makes it easy to adjust the size of thermal resistance section.

Figure 14:
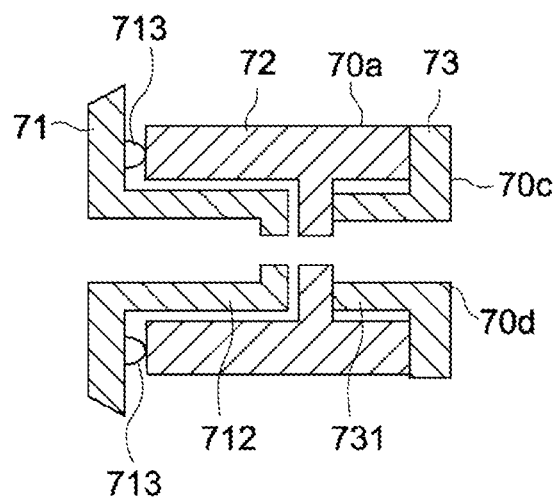
FIG. 14 shows a side cross-sectional view illustrating a modification example of the configuration of the foil trap in accordance with the first embodiment.

Furthermore, in each of the above embodiments, the thermal resistance section TR1 is formed between the cylindrical portion 712 of the shield member 71 and the partition wall 722 of the hub body 72, but the present invention is not limited thereto. For example, as shown in FIG. 14, the disk portion 711 of the shield member 71 may be provided with a plurality of protruding portions 713 that are contactable to the end of the hub body 72, forming a thermal resistance section between a plurality of the protruding portions 713 and the end of the hub body 72. This configuration is also able to reduce the thermal conduction from the shield member 71 to the hub body 72 while allowing the shield member 71 to be stably fixed to the hub body 72.

What is claimed is:

1. A foil trap that captures debris released from a plasma, the foil trap comprising:
   a hub structure having a circumferential surface portion and a front surface portion facing the plasma;
   a plurality of foils that are arranged radially around the hub structure and that are supported by brazing on the circumferential surface portion; and
   a shield member that is disposed on the front surface portion, has a circumferential edge portion for shielding the circumferential surface portion from the plasma, and forms a thermal resistance section between the shield member and the hub structure.

2. The foil trap according to claim 1, wherein the thermal resistance section is a contact layer between the shield member and the hub structure.

3. The foil trap according to claim 2, wherein the contact layer includes a heat insulating material layer.

4. The foil trap according to claim 1, wherein the hub structure is fixed to a front end portion of a rotation shaft including a cooling mechanism.

5. The foil trap according to claim 4, wherein the hub structure further has a rear surface portion having a fitting portion which the rotation shaft fits, and a contact area between the hub structure and the front end portion of the rotation shaft is larger than a contact area between the hub structure and the shield member.

6. The foil trap according to claim 5, wherein the hub structure is a connecting body of a hub body that constitutes the circumferential surface portion and a shaft receptor that constitutes the rear surface portion, and a contact area between the hub body and the shaft receptor is larger than a contact area between the hub body and the shield member.

7. The foil trap according to claim 6, wherein the hub body includes a cylindrical portion that constitutes the circumferential surface portion and a partition wall that divides inside of the cylindrical portion in an axial direction, and the shield member has a cylindrical first convex portion having a bottom surface portion that is in contact with the partition wall.

8. The foil trap according to claim 7, wherein the shaft receptor has a cylindrical second convex portion having a top portion that constitutes the fitting portion and faces the partition wall, and a flange that constitutes the rear surface portion and is in contact with an end portion of the cylindrical portion.

9. The foil trap according to claim 8, further comprising a fastening member that penetrates the bottom surface portion and the partition wall and screws into the front end portion of the rotation shaft.

10. The foil trap according to claim 1, further comprising an extended shield member that is fixed to a facing surface of the shield member and has a surface portion, the facing surface being a surface facing the plasma, the surface portion having an area larger than an area of the facing surface.

11. The foil trap according to claim 10, wherein the extended shield member has a circumferential edge portion having an annular bent portion that bends toward the plurality of foils.

12. A light source apparatus comprising:
a plasma generation chamber;
a light extraction section that extracts light emitted from a plasma generated in the plasma generation chamber; and
a foil trap that is disposed between the plasma generation chamber and the light extraction section, and that captures debris released from the plasma,
the foil trap including
a rotation shaft including a cooling mechanism,
a hub structure having a circumferential surface portion and a front surface portion facing the plasma, and being fixed to a front end portion of the rotation shaft,
a plurality of foils arranged radially around the hub structure and supported by brazing on the circumferential surface portion, and
a shield member disposed on the front surface portion, having a circumferential edge portion that shields the circumferential surface portion from the plasma, and forming a thermal resistance section between the shield member and the hub structure.

13. The light source apparatus according to claim 12, further comprising an aperture that is disposed between the plasma generation chamber and the foil trap, and has an opening for extracting a part of light emitted from the plasma.

* * * * *